United States Patent
Chan et al.

(10) Patent No.: US 8,453,026 B2
(45) Date of Patent: May 28, 2013

(54) PROCESS FOR IMPROVING DESIGN LIMITED YIELD BY EFFICIENTLY CAPTURING AND STORING PRODUCTION TEST DATA FOR ANALYSIS USING CHECKSUMS, HASH VALUES, OR DIGITAL FAULT SIGNATURES

(75) Inventors: Gerald S. Chan, Saratoga, CA (US); Richard C. Dokken, San Ramon, CA (US)

(73) Assignee: Advantest (Singapore) Pte Ltd, Singapore (SG)

( * ) Notice: Subject to any disclaimer, the term of this patent is extended or adjusted under 35 U.S.C. 154(b) by 1369 days.

(21) Appl. No.: 11/565,616

(22) Filed: Nov. 30, 2006

(65) Prior Publication Data

US 2008/0104468 A1    May 1, 2008

Related U.S. Application Data

(60) Provisional application No. 60/829,317, filed on Oct. 13, 2006.

(51) Int. Cl.
*G01R 31/3181* (2006.01)
*G01R 31/34* (2006.01)

(52) U.S. Cl.
USPC .......................................... 714/732; 714/733

(58) Field of Classification Search
None
See application file for complete search history.

(56) References Cited

U.S. PATENT DOCUMENTS

| | | | | |
|---|---|---|---|---|
| 3,906,200 | A * | 9/1975 | Petschauer | 714/710 |
| 4,839,745 | A * | 6/1989 | Tindall | 386/113 |
| 5,444,716 | A * | 8/1995 | Jarwala et al. | 714/727 |
| 5,488,615 | A * | 1/1996 | Kunoff et al. | 714/732 |
| 5,652,754 | A * | 7/1997 | Pizzica | 714/732 |
| 6,381,710 | B1 * | 4/2002 | Kim | 714/45 |
| 2002/0073373 | A1 * | 6/2002 | Nakao et al. | 714/738 |
| 2003/0182552 | A1 * | 9/2003 | Tanimoto et al. | 713/170 |
| 2004/0199573 | A1 * | 10/2004 | Schwartz et al. | 709/201 |
| 2006/0066339 | A1 * | 3/2006 | Rajski et al. | 324/765 |
| 2008/0092003 | A1 * | 4/2008 | Khoche et al. | 714/733 |

FOREIGN PATENT DOCUMENTS

JP    02309431 A  * 12/1990

OTHER PUBLICATIONS

"Secure Hash Standard", U.S. Department of Commerce, Technology Administratioin, National Institute of Standards and Technology, Federal Information Processing Standards Publication, Apr. 17, 1995, pp. 1-21.

U.S. Appl. No. 60/829,317, filed Oct. 13, 2006, Richard C. Dokken, et al.

* cited by examiner

*Primary Examiner* — Ajay Bhatia
*Assistant Examiner* — Dipakkumar Gandhi

(57) ABSTRACT

A process for conserving storage space and time while recording not only a pass or fail result per die but also additional failure test pattern data by computing and comparing digital fault signatures or hash values on a tester.

6 Claims, 4 Drawing Sheets

PROCESS FOR IMPROVING DESIGN LIMITED YIELD BY EFFICIENTLY CAPTURING AND STORING PRODUCTION TEST DATA FOR ANALYSIS USING CHECKSUMS, HASH VALUES, OR DIGITAL FAULT SIGNATURES

CROSS-REFERENCE TO RELATED APPLICATIONS

The present application claims the benefit of priority under 35 USC §119(e) from U.S. provisional patent application 60/829,317 filed Oct. 13, 2006, titled: "A process for improving design limited quality by filtering production test data through a yield monitoring system to localize electrical faults on semiconductor wafers."

BACKGROUND

As manufacturing processes descend below 90 nm resolution, the well proven yield management system tools begin to lose effectiveness. In part, visibility of particulate defects is near the limit of optical inspection tools. Current yield management system tools discern correlations in areas of die which diverge from standard images. These tools cannot currently exploit understanding of the circuit functionality to geometrically locate divergences. There are also design-introduced electrical faults that are yield limiting at these tighter geometries which are detectable in the production test environment.

To improve the testability of high density semiconductor devices, modern design practice inserts additional circuitry specific to test such as scan chains. A scan chain in test mode is configured to be a very long shift register. Patterns generated to operate with scan chains do not have any functional utility and purely observe or control potential electrical defects. But scan chain and bit have little relationship to geometrical location.

To explain the new process, it is first necessary to provide some background on established techniques of SCAN in semiconductor test. The approach of scan methodology is to replace all flip-flops in a design with scan flip-flops. Scan flip-flops provide two paths into each flip-flop: one for the mission of the design, and a second to facilitate test.

There are two most common methods of implementing scan flip-flops today: MUXD and LSSD. The MUXD scan flip-flop approach places a multiplexor or mux on the front end of the D-input. The selector to the mux, known as the scan enable, determines whether to use the mission mode input or the scan test input. The LSSD scan flip-flop approach uses two clocks. One clock latches the mission path input into the flip-flop while the second clock latches the scan test input data into the flip-flop.

By stitching all of the scan flip-flops, or scan cells, together into one or more scan chains, each flip-flop can be preset or observed. This allows for test patterns to be constructed that will concentrate on finding faults in mini sub-circuits. FIG. 1 shows the circuit prior to scan insertion, and FIG. 2 shows the circuit after a MUXD scan insertion.

In FIG. 2, notice that each flip-flop has two input paths as controlled by a mux on the input. When the scan enable "SE" is asserted, the scan chain operates as a shift register. This allows for each flip-flop to be set to a specific state. It also allows for the observation of each flip-flop state as the values are shifted out of the device onto the scan output "SO". Each flip-flop, or scan cell is numbered for the purpose of referencing.

For this example, the 'and' gate can be tested by shifting data into scan cells 3 and 2. After the desired test condition has been loaded, the scan enable is de-asserted and a clock can be applied to capture the output of the combinational logic as observed at scan cell 1. The scan enable is once more applied and the result data as captured at scan cell 1 is shifted through the scan chain until it arrives on the device output for the scan chain.

Historically, testers apply a set of simulated stimulus, and validate that the response on the device outputs match the results expected from the simulation. Functional testers are designed to report in a go/no-go fashion that all of the outputs matched the expected results for all checked strobe points or not. Functional testers are not architected to understand design criteria of the device under test such as the scan structures. Thus, while functional testers can understand which output signals contained failures, each output signal can represent tens of thousands of internal scan cells.

In conventional testers, a test pattern is recorded as pass or fail without retention of a record of the failure test pattern i.e. the actual data output from the device under test which diverges from the acceptance portion of a test vector. Moreover tester storage space and time is at a premium and merely recording all the data is economically unviable.

As it is becoming common for semiconductor companies to apply design-for-test (DFT) methodologies into their chip designs, it is no longer acceptable for automated test equipment (ATE) to continue to perform black box type testing and record only a pass/fail conclusion per device. Rather, it is necessary for ATE to capture each and every failure coming out from the device.

With the deployment of a new class of ATE called structural tester, test engineers not only can capture all the failures from the device, but can also map each failure back to individual flip flop. The problem being solved becomes the amount of data that is generated as 1+ million flops designs are becoming commonplace. Especially so, during first silicon debug or initial wafer probe where there can be a lot of failures generated, either from a new design or from an immature process. Furthermore, to facilitate new silicon or process debug, these failure data are stored, usually in STDF format, into computer-readable media for later consumption by analysis tools. Thus it can be appreciated that what is needed is a method of compacting failure data which reduces the amount of data logged.

DETAILED DESCRIPTION OF THE INVENTION

The present invention comprises, for each test for each device, generating a digital fault signature for the failure data. For a digital fault signature not previously encountered, both the digital fault signature and the failure data are stored. Whereas for a digital fault signature that was encountered before, the digital signature is simply stored.

During testing, it is the task of the tester OS to sequence through:
Applying the proper test pattern to the device under test and run the test.
Collecting the failure data, if any.
Writing out the failure data to computer-readable media.

Figure 1:
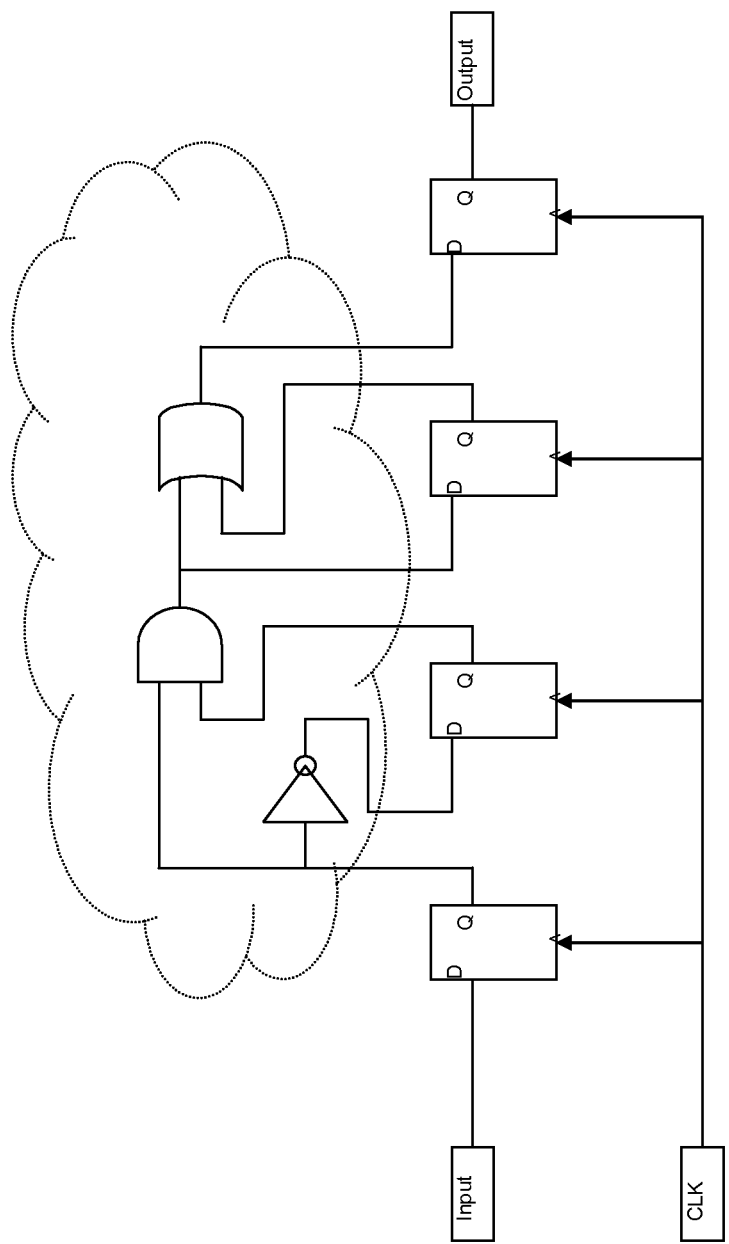
FIG. 1 illustrates a logic circuit prior to scan insertion.
Figure 2:
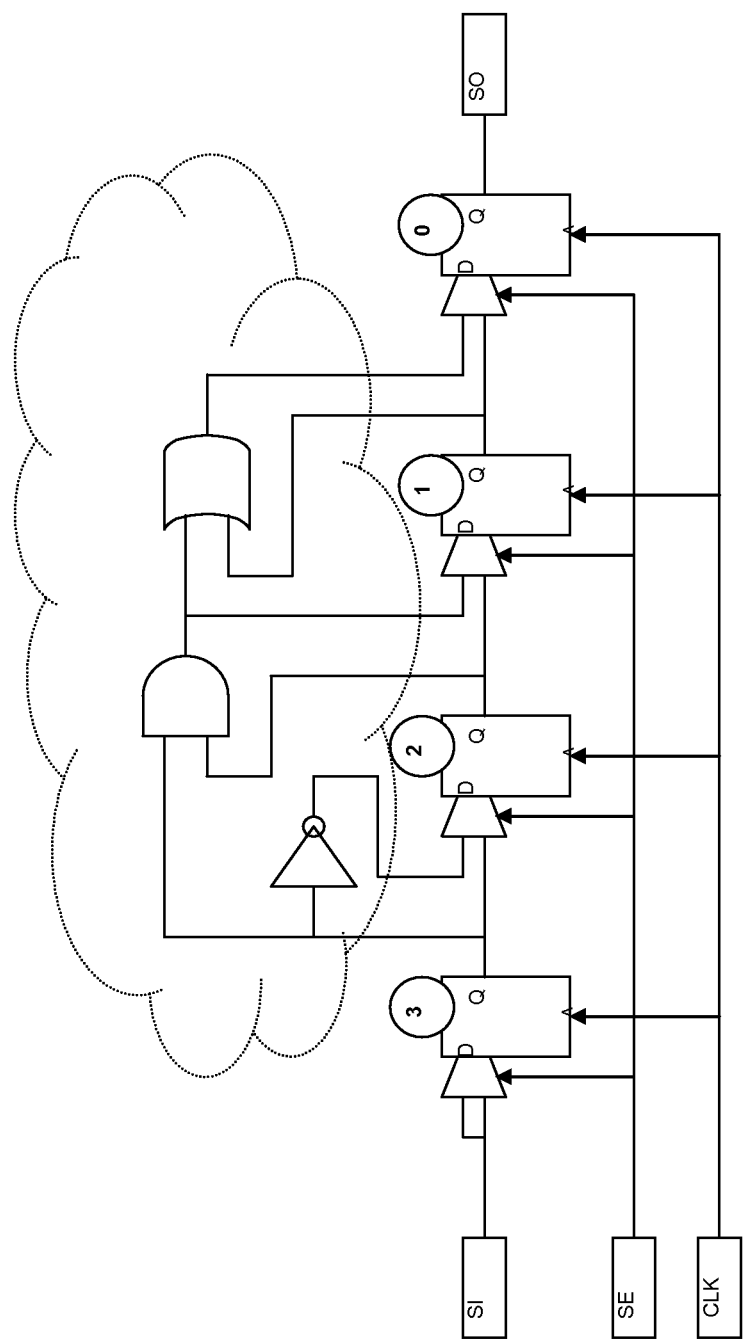
FIG. 2 illustrates a logic circuit after scan insertion.
Figure 3:
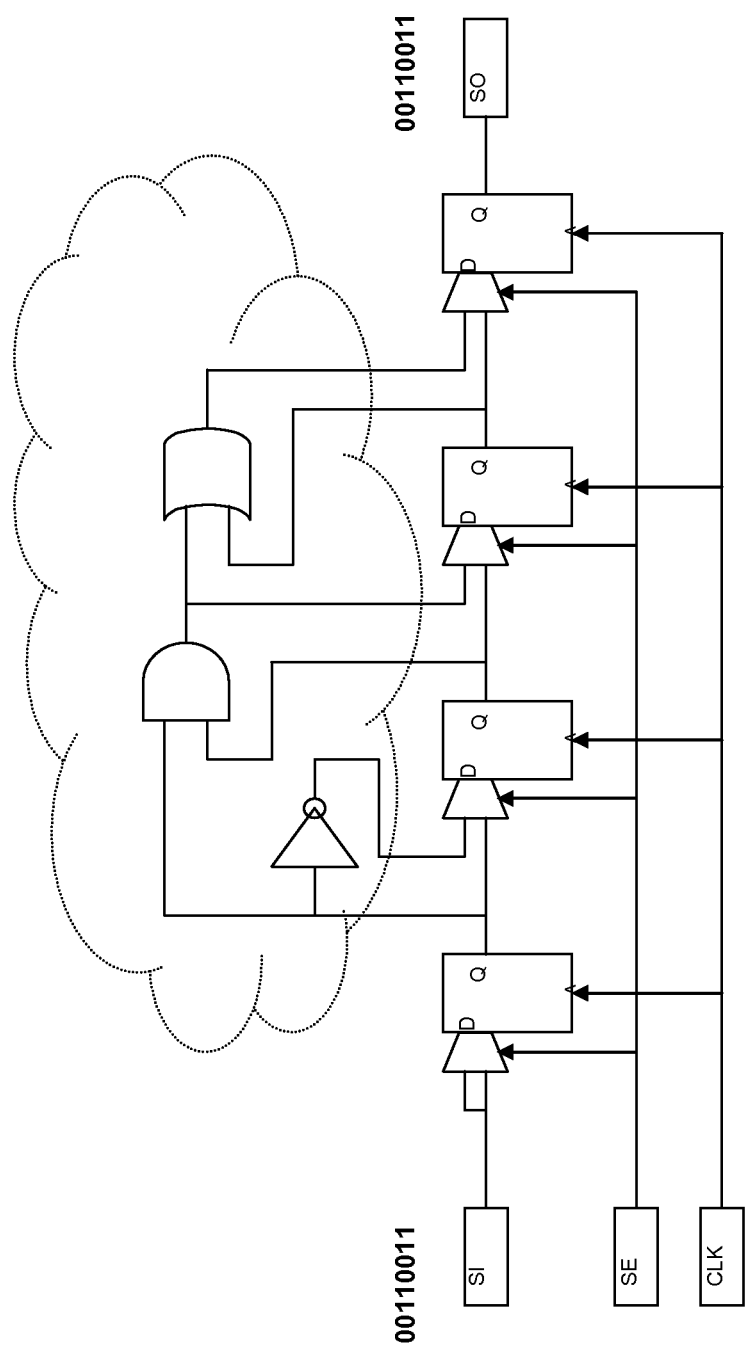
FIG. 3 illustrates a scan chain test.
Figure 4:
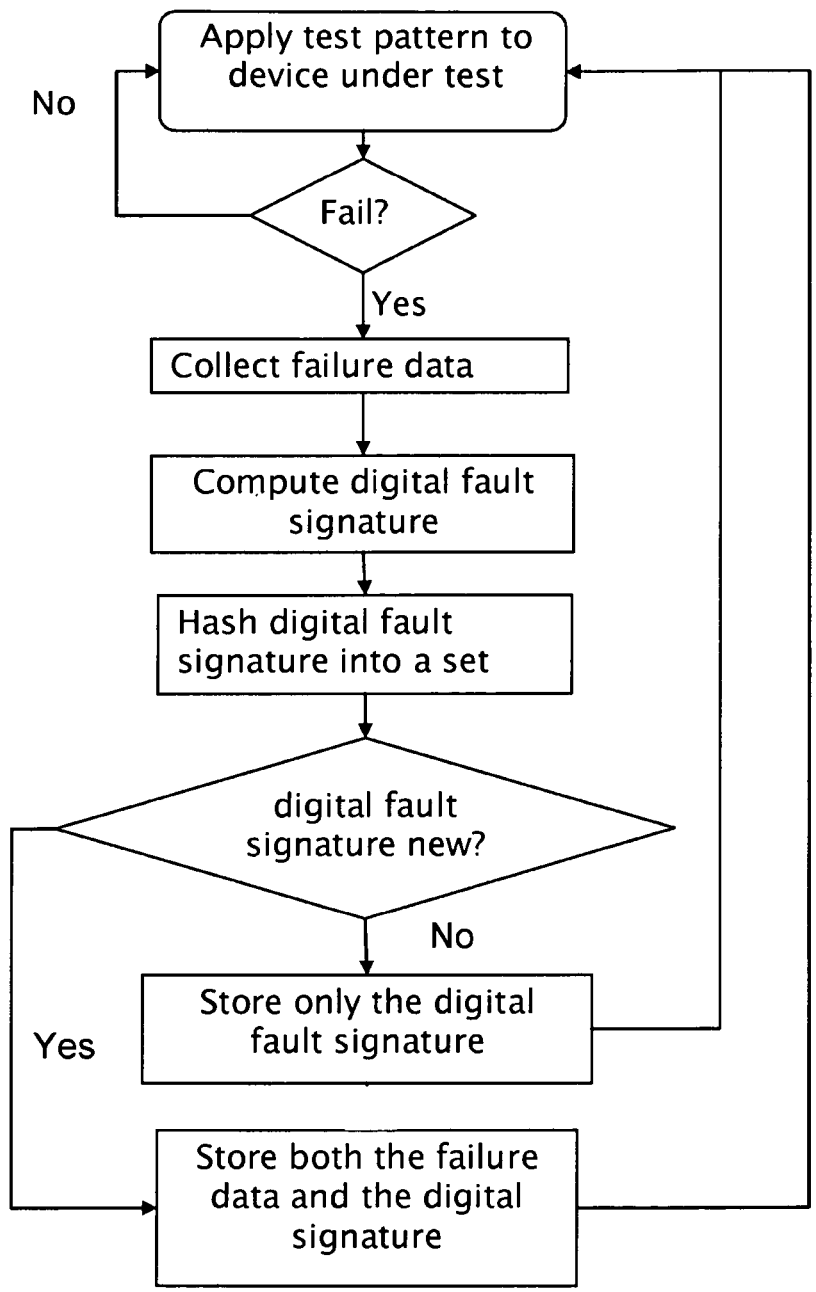
FIG. 4 provides a fail test pattern storage flowchart.

FIG. 4 is a flow chart which depicts, on the tester OS side, how a digital fault signature can aid in failure data compaction for writing out the failure data to computer-readable media.

Referring now to FIG. 4, a digital fault signature is computed from the resulting failure data on a test pattern by test pattern basis. For example, for a 2 sites STIL program with 2 test pattern statements, each run of the test program yields the following failure records in STDF format:

Part Information Record for site 1.
Part Information Record for site 2.
Structural Test Record for site 1 test pattern 1.
Structural Test Record for site 2 test pattern 1.
Structural Test Record for site 1 test pattern 2.
Structural Test Record for site 2 test pattern 2.
Part Result Record for site 1.
Part Result Record for site 2.

Based on this example, for each run of the test program, there will be a total of four digital signatures computed, one for each structural test record in the example. Furthermore, each one of the structural test records in the above example represents one pass through the flow chart. Each time a digital fault signature is computed, it is compared against all the digital fault signatures there were created before. And for volume testing, the above STDF records are repeated for every two devices that are tested in parallel for the two sites test program example. Each time, four more digital fault signatures are computed.

In an embodiment a digital fault signature is computed based on a one-way hashing algorithm such as SHA-2 (see, e.g., Federal Information Processing Standards Publication 180-1, Apr. 17, 1995) or WHIRLPOOL. One-way hashing algorithm is sufficient since we are not attempting to recreate the original failure data from the digital fault signature. In addition, these one-way hashing algorithms generally result in keys of 32, 64 or more bytes. Rather than writing the key as is, all we need to write is a unique representation of each key—for example, a 4 bytes global running number would be sufficient—hence cutting down on storage space for the key.

As each test pattern applied to the device under test can potentially generate a large quantity of failure data, it is not practical to generate a digital fault signature based on all the data at once. Rather, in an embodiment a method can be employed such that a transient digital signature is computed per 1000 fail records. This transient digital fault signature is appended to the next 1000 fail records to compute yet another transient digital fault signature. This is repeated until all the fail records are included as part of the computation to yield a final digital fault signature.

The step in the above flow chart that says "Hash digital signature into a set" is simply to use a set function to check if the digital signature was encountered before. A simple string comparison on the 32 or 64 bytes key can be used to determine digital signature equality.

The fact that failure data is only logged per each unique digital fault signature represents the data compaction.

As mentioned before, the failure data logged are later consumed by analysis tools to perform either silicon or process debug. The way these analysis tools should use the digital fault signature is to create an overall mapping table, that is, for each unique digital fault signature, what are all the Structural Test Records that share this same key. With the understanding that only the first instance of these Structural Test Records that share the same digital fault signature will actually hold the failure data.

To efficiently store on computer-readable media a result of a pattern-based test on automated test equipment apparatus, the invention has the following steps:

computing a first digital fault signature from a first failing test pattern data log and a second digital fault signature from a second failing test pattern data log;
storing the first failing test pattern data log and the first digital fault signature on a computer-readable media;
storing the second digital fault signature and
storing the second failing test pattern if the second digital fault signature was not encountered before. A digital fault signature may be a checksum, a compressed file, a hash value, and a linear feedback shift register output or some other fingerprint with low probability of being shared between distinct test pattern logs.

A method for efficiently using automated test equipment (ATE) while accumulating failure information for analysis includes the steps of: computing a digital fault signature for an ATE failure pattern, checking if the digital fault signature was encountered before, and storing ATE failure data into an ATE failure pattern log.

A digital fault signature is a more compact representation of data such as a checksum, a compressed file, a hash value, and an output of a linear feedback shift register. It is not necessary that the original data be recoverable from the signature. Only a reasonably low probability that two data values do not result in the same digital fault signature is desired.

Only in the case where a failure test pattern has not been previously found in the log does the present invention consume resources for storing ATE failure data into an ATE failure pattern log by storing an ATE failure pattern and a digital fault signature. It is the objective of the present invention to minimize this event.

The present invention is a method for efficiently storing on computer-readable media a result of a pattern-based test on automated test equipment apparatus comprising the steps of: computing a first digital fault signature from a first failure test pattern and a second digital fault signature from a second failing test pattern; storing the first failure test pattern and the first digital fault signature on a computer-readable media; and storing the second failure test pattern and the second digital fault signature only if the second digital fault signature was not encountered before whereby storage space and storage time is reduced when a failure test pattern repeats.

The scope of the invention should be determined by the appended claims and their legal equivalents, rather than the examples given to provide illustrations of presently preferred embodiments.

What is claimed is:

1. A method for conserving storage space and time while recording not only a pass or fail result per die but also additional failure test pattern data by computing and comparing a plurality of digital fault signatures on automated test equipment (ATE) apparatus, comprising the steps of:
   computing a digital fault signature for an ATE failure pattern,
   checking if the digital fault signature has been encountered before, and
   storing ATE failure data into an ATE failure pattern log only when the digital fault signature has not been encountered before.

2. The method of claim 1 wherein the digital fault signature is one of a group comprised of a checksum, a compressed file, a hash value, and an output of a linear feedback shift register.

3. The method of claim 1 wherein storing ATE failure data into the ATE failure pattern log comprises storing a pattern number and the digital fault signature.

4. The method of claim 1 wherein storing ATE failure data into the ATE failure pattern log comprises storing a pattern number, a failure pattern, and the digital fault signature.

5. The method of claim 1 wherein storing ATE failure data into the ATE failure pattern log comprises storing a failure pattern and the digital fault signature.

6. The method of claim 1 wherein storing ATE failure data into the ATE failure pattern log comprises recording on computer readable media the digital fault signature and a failure pattern when the digital fault signature is not previously recorded.

\* \* \* \* \*